(12) United States Patent
Kim et al.

(10) Patent No.: US 11,903,129 B2
(45) Date of Patent: Feb. 13, 2024

(54) PRINTED CIRCUIT BOARD

(71) Applicant: SAMSUNG ELECTRO-MECHANICS CO., LTD., Suwon-si (KR)

(72) Inventors: Chi Seong Kim, Suwon-si (KR); Won Seok Lee, Suwon-si (KR); Guh Hwan Lim, Suwon-si (KR); Jin Uk Lee, Suwon-si (KR); Jin Oh Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/691,772

(22) Filed: Mar. 10, 2022

(65) Prior Publication Data

US 2023/0141270 A1     May 11, 2023

(30) Foreign Application Priority Data

Nov. 9, 2021   (KR) .................. 10-2021-0152892

(51) Int. Cl.
*H05K 1/02* (2006.01)
*H01L 23/13* (2006.01)
(Continued)

(52) U.S. Cl.
CPC ............ *H05K 1/119* (2013.01); *H05K 1/183* (2013.01); *H05K 3/0035* (2013.01);
(Continued)

(58) Field of Classification Search
CPC ........ H05K 1/115; H05K 1/119; H05K 1/183; H05K 1/186; H05K 3/0035; H05K 3/0038; H05K 3/0044; H05K 3/429; H05K 3/4605; H05K 3/4661; H05K 3/4697; H05K 2201/096; H05K 2201/09827; H05K 2201/09854; H05K 1/02; H05K 1/0231; H05K 1/111; H05K 1/181; H05K 1/185; H01L 23/13; H01L 23/66; H01L 23/481; H01L 23/4697; H01L 23/5389; H01L 25/0652; H01L 25/0657; H01L 25/0753;
(Continued)

(56) References Cited

U.S. PATENT DOCUMENTS 8,324,654 B2 *  12/2012  An ...................... H01L 33/486
                                                           257/E33.059
8,760,049 B2 *   6/2014  Cha ..................... G02B 6/0068
                                                                  313/512
(Continued)

FOREIGN PATENT DOCUMENTS

JP    2017-069446 A    4/2017
JP    2019-047063 A    3/2019
(Continued)

*Primary Examiner* — Xiaoliang Chen
(74) *Attorney, Agent, or Firm* — Morgan, Lewis & Bockius LLP

(57) ABSTRACT

A printed circuit board includes: a first insulating material; and a second insulating material disposed on one surface of the first insulating material, and including first and second cavities having depths different from each other. At least one groove portion is disposed in a side surface of each of the first and second cavities.

9 Claims, 15 Drawing Sheets

(51) Int. Cl.
*H01L 23/66* (2006.01)
*H05B 45/20* (2020.01)
*H05K 1/11* (2006.01)
*H05K 1/18* (2006.01)
*H05K 3/00* (2006.01)

(52) U.S. Cl.
CPC ......... *H05K 3/0038* (2013.01); *H05K 3/0044* (2013.01); *H05K 2201/09827* (2013.01); *H05K 2201/09854* (2013.01)

(58) Field of Classification Search
CPC ............... H01L 21/486; H01L 21/4853; H01L 23/49822; H01L 23/49827; H05B 45/20; G02B 6/009; G02B 6/0068
USPC .......... 174/260; 438/106, 107, 125, 396, 26; 313/512; 362/184, 231; 455/23, 334; 257/88, 89, 100, 33.058, 33.059, 33.067
See application file for complete search history.

(56) References Cited

U.S. PATENT DOCUMENTS

| | | | |
|---|---|---|---|
| 2003/0148552 A1* | 8/2003 | Halahan | H01L 23/481 257/E21.597 |
| 2005/0012192 A1* | 1/2005 | Saso | H05K 1/141 257/E23.114 |
| 2006/0245188 A1* | 11/2006 | Takenaka | H01L 25/0753 362/267 |
| 2010/0157583 A1* | 6/2010 | Nakajima | H01L 25/0753 257/E33.059 |
| 2010/0190464 A1* | 7/2010 | Chen | H01L 23/66 438/106 |
| 2010/0327068 A1* | 12/2010 | Chen | G06K 19/07749 235/492 |
| 2014/0233086 A1* | 8/2014 | Oberst | B81B 7/007 359/291 |
| 2015/0262902 A1* | 9/2015 | Shen | H01L 23/147 438/107 |
| 2016/0181145 A1* | 6/2016 | Hossain | H01L 25/0657 438/396 |
| 2020/0008302 A1* | 1/2020 | Jain | H05K 1/183 |
| 2020/0066543 A1* | 2/2020 | Jain | H01L 24/06 |
| 2021/0166993 A1* | 6/2021 | Yen | H01L 21/486 |
| 2021/0307172 A1* | 9/2021 | Darmawikarta | H05K 1/116 |
| 2022/0039261 A1* | 2/2022 | Hwang | H05K 1/115 |
| 2022/0075112 A1* | 3/2022 | Cardile | G02B 6/42 |

FOREIGN PATENT DOCUMENTS

| | | |
|---|---|---|
| JP | 2019-197853 A | 11/2019 |
| KR | 10-2022-0015011 A | 2/2022 |

\* cited by examiner

PRINTED CIRCUIT BOARD

CROSS-REFERENCE TO RELATED APPLICATION(S)

This application claims benefit of priority to Korean Patent Application No. 10-2021-0152892 filed on Nov. 9, 2021 in the Korean Intellectual Property Office, the disclosure of which is incorporated herein by reference in its entirety.

TECHNICAL FIELD

The present disclosure relates to a printed circuit board.

BACKGROUND

In order to follow the recent trend of mobile devices towards weight reduction and size reduction, there has also been a growing need for making printed circuit boards to be mounted thereon lighter, thinner, shorter, and smaller.

Accordingly, in order to form micro-vias connecting layers to each other in the printed circuit boards, techniques for efficiently processing micro-via holes are required. In addition, it is required that the wiring materials filling the micro-via holes have excellent electrical and mechanical properties.

Meanwhile, to meet technical requirements according to the mobile devices that have become lighter, thinner, shorter, and smaller, there has been a need for a technology for inserting electronic components such as ICs, active devices, or passive devices into a board to shorten a connection path between the electronic components and reduce noise. Accordingly, research on the technology for embedding a component into a board has recently been continued in various ways.

In particular, a board is formed to have cavities therein to insert various components into the board, and a technique using a blasting process or the like is performed to form cavities.

SUMMARY

An aspect of the present disclosure may provide a printed circuit board including a fine circuit and/or a fine via.

Another aspect of the present disclosure may provide a printed circuit board with an electronic component mounted in a cavity thereof.

Another aspect of the present disclosure may provide a printed circuit board having a reduced process variation when a cavity thereof is formed.

According to an aspect of the present disclosure, a printed circuit board may include: a first insulating material; and a second insulating material disposed on one surface of the first insulating material, and including first and second cavities having depths different from each other. At least one groove portion is disposed in a side surface of each of the first and second cavities.

According to another aspect of the present disclosure, a printed circuit board may include: a first insulating material; a second insulating material disposed on one surface of the first insulating material, and including a plurality of cavities having different depths different from to each other; and a resin layer at least partially embedded in the second insulating material, and disposed on a bottom surface of at least one of the plurality of cavities.

According to another aspect of the present disclosure, a printed circuit board may include: a first insulating material; a plurality of insulating layers disposed on the first insulating material, and including first and second cavities penetrating through one or more of the plurality of insulating layers; and a plurality of circuit layers disposed on or embedded in the plurality of insulating layers, respectively. A first number of insulating layers among the plurality of insulating layers, penetrated through by the first cavity, is different from a second number of insulating layers among the plurality of insulating layers, penetrated through by the second cavity.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
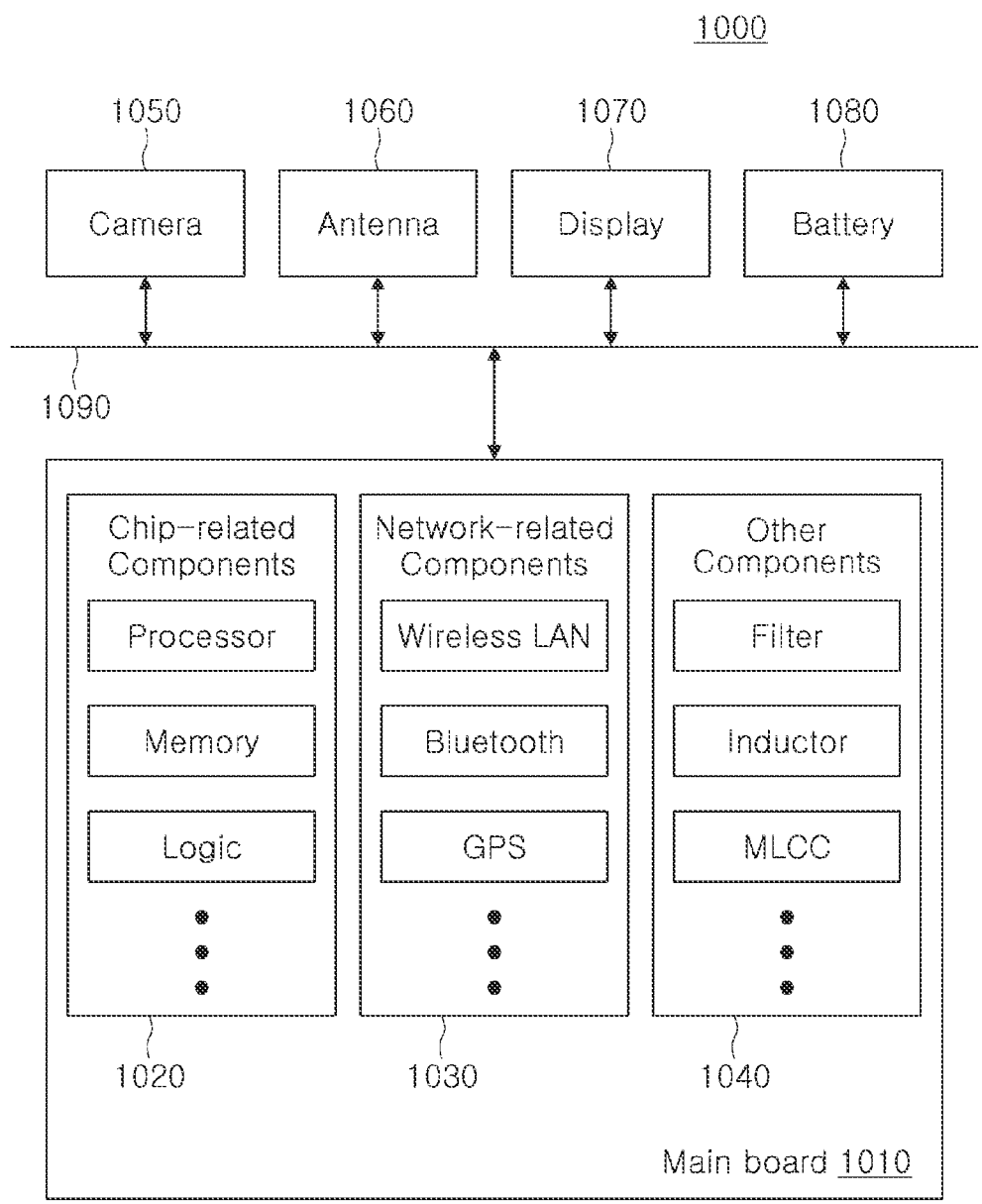
FIG. 1 is a diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto.

These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, these electronic components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related electronic components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related electronic components 1020 and/or the network-related electronic components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
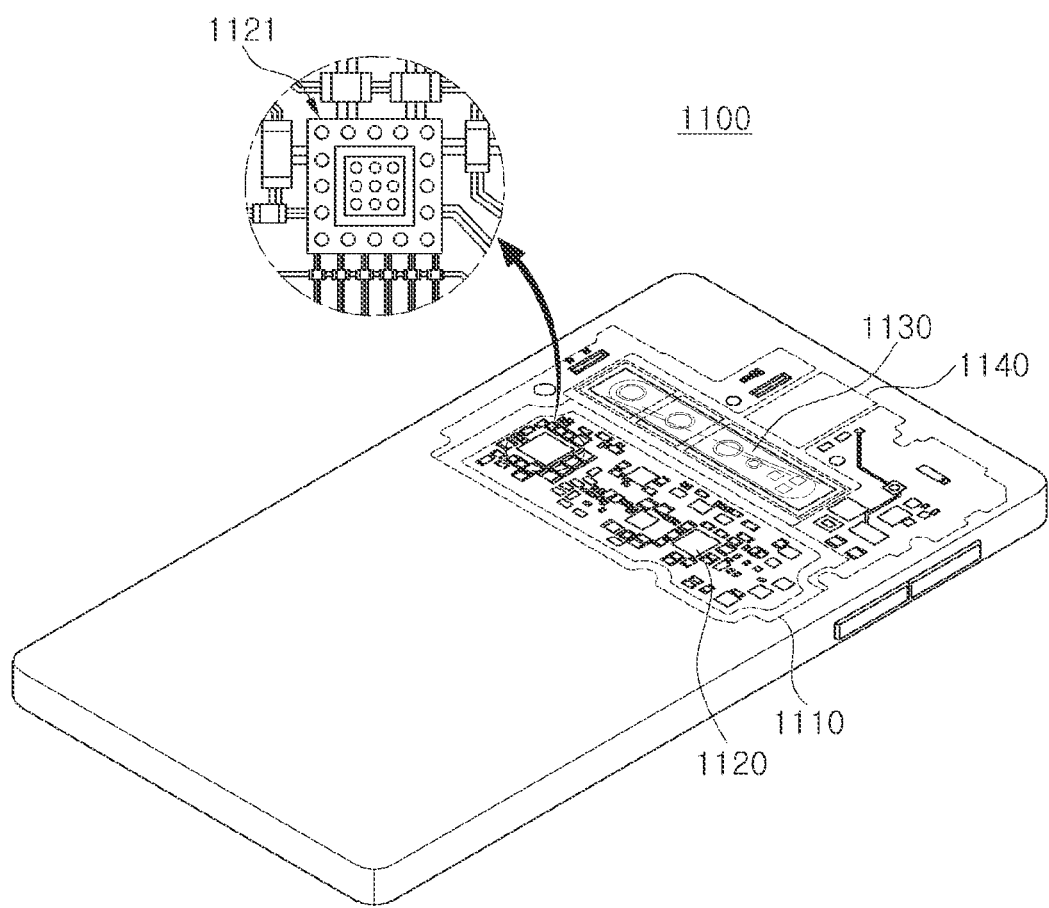
FIG. 2 is a diagram schematically illustrating an exemplary embodiment of an electronic device.

FIG. 2 is a perspective view schematically illustrating an exemplary embodiment of an electronic device.

Referring to FIG. 2, the electronic device may be, for example, a smartphone 1100. A mainboard 1110 may be accommodated in the smartphone 1100, and various electronic components 1120 may be physically and/or electrically connected to the mainboard 1110. In addition, other electronic components that may or may not be physically and/or electrically connected to the mainboard 1110, such as a camera module 1130 and/or a speaker 1140, may also be accommodated therein. Some of the electronic components 1120 may be the above-described chip-related components, e.g., an antenna module 1121, but are not limited thereto. The antenna module 1121 may be in such a form that the electronic component is surface-mounted on a printed circuit board, but is not limited thereto. Meanwhile, the electronic device is not necessarily limited to the smartphone 1100, but may be any other electronic device as described above.

Printed Circuit Board

Figure 3A:
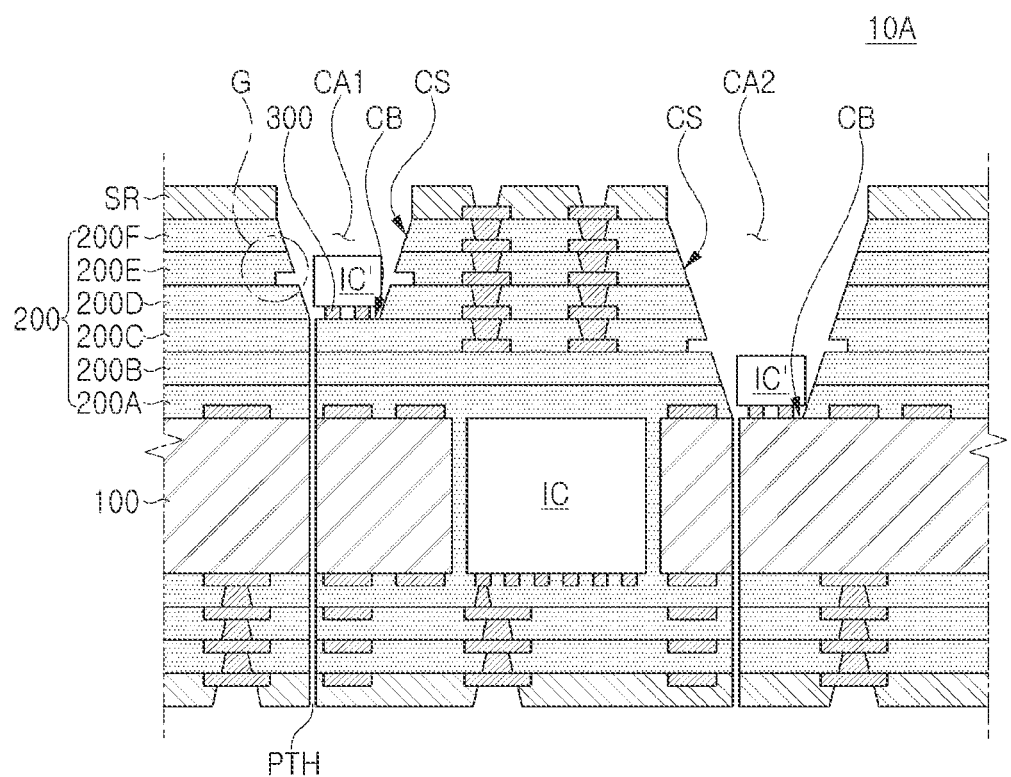
FIG. 3A is a diagram schematically illustrating an exemplary embodiment of a printed circuit board according to the present disclosure.

FIG. 3A is a diagram schematically illustrating an exemplary embodiment of a printed circuit board 10A according to the present disclosure.

Referring to FIG. 3A, the printed circuit board 10A according to the present disclosure may include a first insulating material 100, and a second insulating material 200 disposed on one surface of the first insulating material 100 and including first and second cavities CA1 and CA2 having depths different from each other. In this case, the first and second cavities CA1 and CA2 may be spaced apart from each other, but are not limited thereto. In addition, the first insulating material 100 may be an intermediate insulating layer or a core layer, but is not limited thereto.

In addition, the first and second cavities CA1 and CA2 having depths different from each other may penetrate through at least a portion of the second insulating material 200 including a plurality of insulating layers 200A to 200F, and the respective numbers of insulating layers through which the first and second cavities CA1 and CA2 penetrate among the plurality of insulating layers 200A to 200F may be different from each other, but are not limited thereto.

The printed circuit board 10A according to the present disclosure may include at least one groove portion G in a side surface CS of each of the first and second cavities CA1 and CA2 formed in the second insulating material 200.

In the printed circuit board 10A according to the present disclosure, a metal layer 300 may be disposed on a bottom surface CB of each of the first and second cavities CA1 and CA2. In this case, the metal layer 300 may be formed to protrude from the bottom surface CB of each of the first and second cavities CA1 and CA2, but is not limited thereto. In addition, the metal layer 300 may function as a connection pad connected to an electronic component IC' mounted in each of the first and second cavities CA1 and CA2, but is not limited thereto.

In the printed circuit board 10A according to the present disclosure, at least one build-up insulating layer and at least one circuit layer may be disposed on the other surface facing the one surface of the first insulating material 100. That is, at least one build-up insulating layer and at least one circuit layer may be disposed on each of both surfaces of the first insulating material 100, and in this case, a plurality of cavities CA1 and CA2 may be disposed through at least one build-up insulating layer disposed on one surface of the first insulating material 100, but are not limited thereto.

The groove portion G of the printed circuit board 10A according to the present disclosure may be a region where a metal material M to be described later functioning as a stopper at the time of forming each of the first and second cavities CA1 and CA2 is removed, and in this case, some of the metal material M may not be removed and the metal material M may remain in the groove portion G, but is not limited thereto.

Since the metal material M embedded in the second insulating material 200 functions as a stopper at the time of forming each of the first and second cavities CA1 and CA2 as described above, a process of forming the first and second cavities CA1 and CA2 having depths different from each other can be simplified, but the metal material M is not limited thereto.

The printed circuit board 10A according to the present disclosure may further include a through hole PTH penetrating through both the first and second insulating materials 100 and 200 and connected to the bottom surface CB of each of the first and second cavities CA1 and CA2, but is not limited thereto.

The first insulating material 100 of the printed circuit board 10A according to the present disclosure may be a core substrate, but is not limited thereto.

In addition, each of the first and second insulating materials 100 and 200 of the printed circuit board 10A according to the present disclosure may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, the first and second insulating materials 100 and 200 may include different insulating materials from each other, and in this case, the second insulating material 200 may include prepreg, but is not limited thereto.

Each of the circuit layers, the vias, and the metal layers 300 of the printed circuit board 10A according to the present disclosure may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto.

In addition, each of the circuit layers, the metal layers 300, and the vias of the printed circuit board 10A according to the present disclosure may include an electroless plating layer and an electrolytic plating layer. The electroless plating layer may serve as a seed layer for the electrolytic plating layer, but is not limited thereto.

The electroless plating layer and the electrolytic plating layer may also include copper (Cu), aluminum (Al), silver (Ag), tin (Sn), gold (Au), nickel (Ni), lead (Pb), titanium (Ti), palladium (Pd), or an alloy thereof.

In addition, the printed circuit board 10A according to the present disclosure may further include a solder resist layer SR disposed on one surface of the second insulating material 200 to cover at least a portion of an uppermost circuit layer on which a surface treatment layer is formed. In this case, the solder resist layer SR may be formed of a photosensitive material. In addition, the solder resist layer SR may have thermosetting and/or photocurable properties, but is not limited thereto.

Figure 3B:
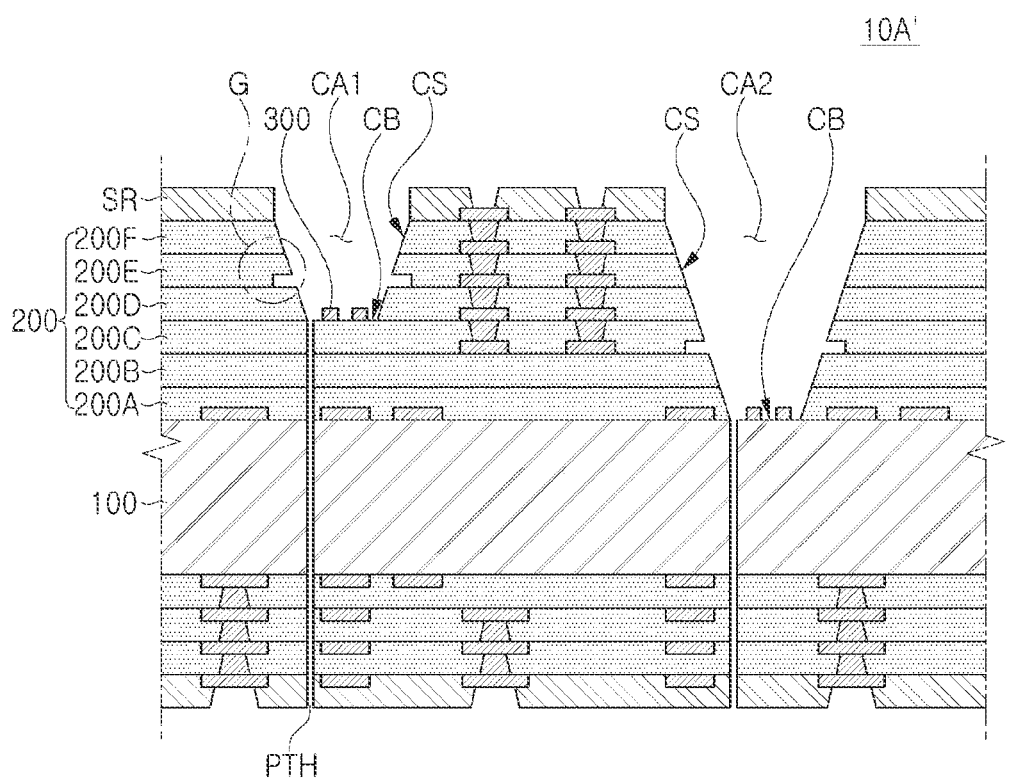
FIG. 3B is a diagram schematically illustrating an exemplary embodiment of a printed circuit board according to the present disclosure.

FIG. 3B is a diagram schematically illustrating an exemplary embodiment of a printed circuit board according to the present disclosure. FIG. 3B is substantially the same as FIG. 3A, except that the electronic component IC is omitted. For overlapping configurations, the above-described descriptions may be equally applied thereto, and detailed descriptions of FIG. 3B will be omitted.

Figure 4:
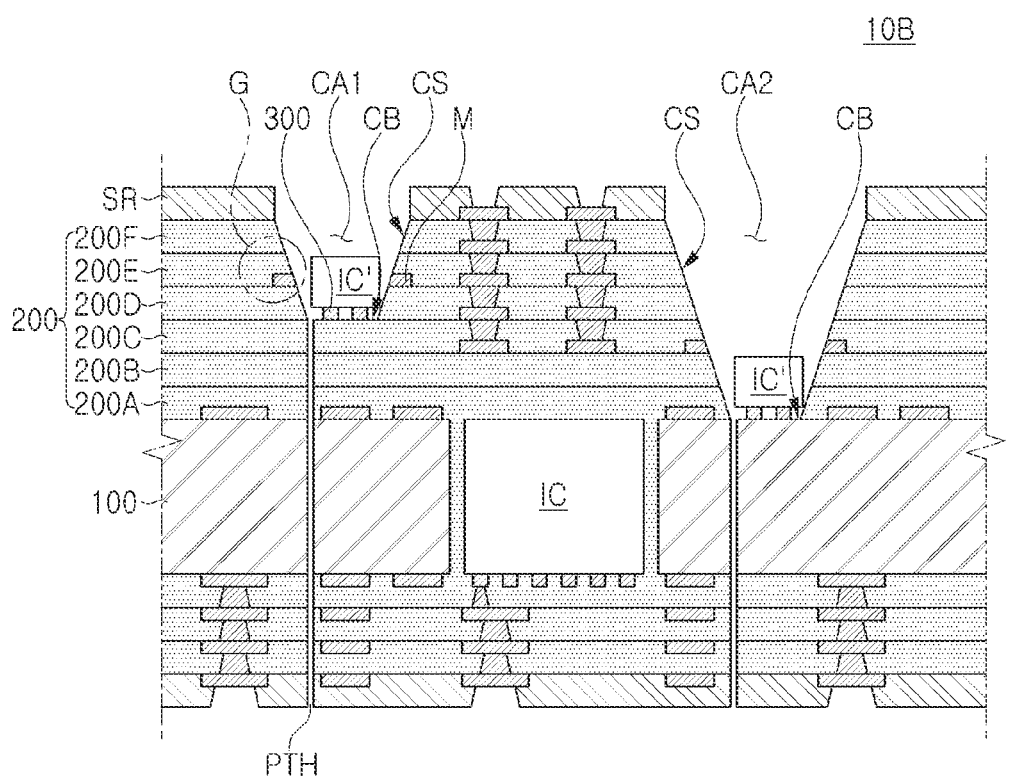
FIG. 4 is a diagram schematically illustrating an exemplary embodiment of a printed circuit board according to the present disclosure.

FIG. 4 is a diagram schematically illustrating an exemplary embodiment of a printed circuit board 10B according to the present disclosure.

Referring to FIG. 4, the printed circuit board 10B according to the present disclosure may include a first insulating material 100, and a second insulating material 200 disposed on one surface of the first insulating material 100 and including first and second cavities CA1 and CA2 having depths different from each other. In this case, the first and second cavities CA1 and CA2 may be spaced apart from each other, but are not limited thereto. In addition, the first insulating material 100 may be an intermediate insulating layer or a core layer, but is not limited thereto.

In addition, the printed circuit board 10B according to the present disclosure may include at least one groove portion G in a side surface CS of each of the first and second cavities CA1 and CA2 formed in the second insulating material 200. In this case, the groove portion G of each of the first and second cavities CA1 and CA2 may be filled with a metal material M, but is not limited thereto.

Each of the circuit layers, the vias, the metal layers 300, and the metal materials M of the printed circuit board 10B according to the present disclosure may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto.

Concerning the other components, what has been described above is substantially identically applicable, and thus, the description thereof will not be repeated.

Figure 5A:
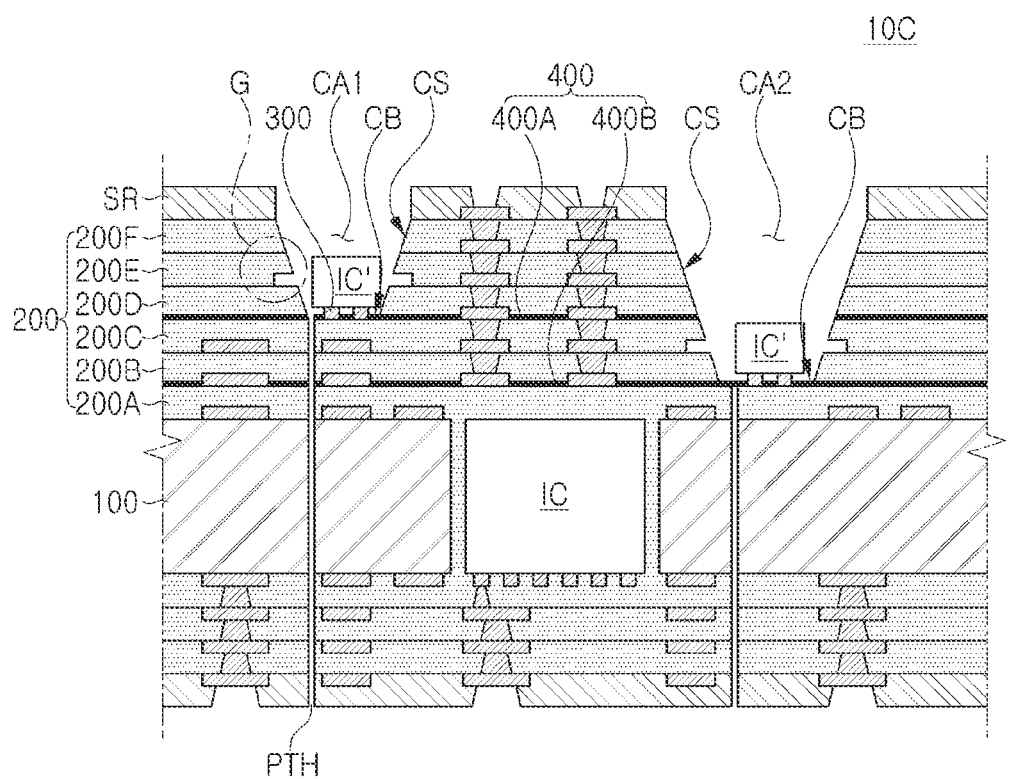
FIG. 5A is a diagram schematically illustrating an exemplary embodiment of a printed circuit board according to the present disclosure.

FIG. 5A is a diagram schematically illustrating an exemplary embodiment of a printed circuit board 10C according to the present disclosure.

Referring to FIG. 5A, the printed circuit board 10C according to the present disclosure may include a first insulating material 100, a second insulating material 200 disposed on one surface of the first insulating material 100 and including a plurality of cavities CA1 and CA2 having depths different from each other, and a resin layer 400 at least partially embedded in the second insulating material 200. In this case, the resin layer 400 may be exposed to at least some of the respective bottom surfaces CB and side surfaces CS of the plurality of cavities C, but is not limited thereto.

In the printed circuit board 10C according to the present disclosure, the second insulating material 200 may include a plurality of insulating layers 200A to 200F, and the resin layer 400 may include a plurality of resin layers 400A and 400B spaced apart from each other. In this case, at least one of the plurality of insulating layers 200A to 200F may be disposed between the plurality of resin layers 400A and 400B.

In addition, each of the plurality of resin layers 400A and 400B may be exposed to at least some of the respective bottom surfaces and side surfaces of the plurality of cavities C, but is not limited thereto.

In addition, the resin layer 400 of the printed circuit board 10C according to the present disclosure may include a different material from each of the first and second insulating materials 100 and 200, but is not limited thereto.

In the printed circuit board 10C according to the present disclosure, a metal layer 300 may be disposed on the bottom surface CB of each of the plurality of cavities CA1 and CA2, and the metal layer 300 may be formed to protrude from the bottom surface CB of each of the plurality of cavities CA1 and CA2, but is not limited thereto. In addition, at least a portion of the metal layer 300 may be in contact with the resin layer 400, but is not limited thereto. In addition, the metal layer 300 may function as a connection pad connected to an electronic component IC' mounted on each of the plurality of cavities CA1 and CA2 , but is not limited thereto.

The printed circuit board 10C according to the present disclosure may include at least one groove portion G disposed in the side surface CS of each of the plurality of cavities CA1 and CA2, but is not limited thereto.

The groove portions G of each of the plurality of cavities CA1 and CA2 of the printed circuit board 10C according to the present disclosure may be disposed in the same one of the plurality of insulating layers 200A to 200F of the second insulating material 200, but are not limited thereto.

In the printed circuit board 10C according to the present disclosure, at least one build-up insulating layer and at least one circuit layer may be disposed on the other surface facing one surface of the first insulating material 100. That is, at least one build-up insulating layer and at least one circuit layer may be disposed on each of both surfaces of the first insulating material 100, and in this case, a plurality of cavities CA1 and CA2 may be disposed through at least one build-up insulating layer disposed on one surface of the first insulating material 100, but are not limited thereto.

The groove portion G of the printed circuit board 10C according to the present disclosure may be a region where a metal material M to be described later functioning as a stopper at the time of forming each of the plurality of cavities CA1 and CA2 is removed, and in this case, some of the metal material M may not be removed and the metal material M may remain in the groove portion G, but is not limited thereto.

Since the metal material embedded in the second insulating material 200 functions as a stopper at the time of forming each of the plurality of cavities CA1 and CA2 as described above, a process of forming the plurality of cavities CA1 and CA2 having depths different from each other can be simplified, but the metal material is not limited thereto.

The printed circuit board 10C according to the present disclosure may further include a through hole PTH penetrating through both the first and second insulating materials 100 and 200 and connected to the bottom surface CB of each of the plurality of cavities CA1 and CA2, but is not limited thereto.

The first insulating material 100 of the printed circuit board 10C according to the present disclosure may be a core substrate, but is not limited thereto.

In addition, each of the first and second insulating materials 100 and 200 of the printed circuit board 10C according to the present disclosure may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, the first and second insulating materials 100 and 200 may include different insulating materials to each other, and in this case, the second insulating material 200 may include prepreg, but is not limited thereto.

Each of the circuit layers, the vias, and the metal layers 300 of the printed circuit board 10C according to the present disclosure may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto.

In addition, each of the circuit layers, the metal layers 300, and the vias of the printed circuit board 10C according to the present disclosure may include an electroless plating layer and an electrolytic plating layer. The electroless plating layer may serve as a seed layer for the electrolytic plating layer, but is not limited thereto.

The electroless plating layer and the electrolytic plating layer may also include copper (Cu), aluminum (Al), silver (Ag), tin (Sn), gold (Au), nickel (Ni), lead (Pb), titanium (Ti), palladium (Pd), or an alloy thereof.

In addition, the printed circuit board 10C according to the present disclosure may further include a solder resist layer SR disposed on one surface of the second insulating material 200 to cover at least a portion of an uppermost circuit layer on which a surface treatment layer is formed. In this case, the solder resist layer SR may be formed of a photosensitive material. In addition, the solder resist layer SR may have thermosetting and/or photocurable properties, but is not limited thereto.

The resin layer 400 of the printed circuit board 10C according to the present disclosure may include a filler, and particularly, the resin layer 400 may include a material having a higher rigidity than the second insulating material 200, but is not limited thereto.

Concerning the other components, what has been described above is substantially identically applicable, and thus, the description thereof will not be repeated.

Figure 5B:
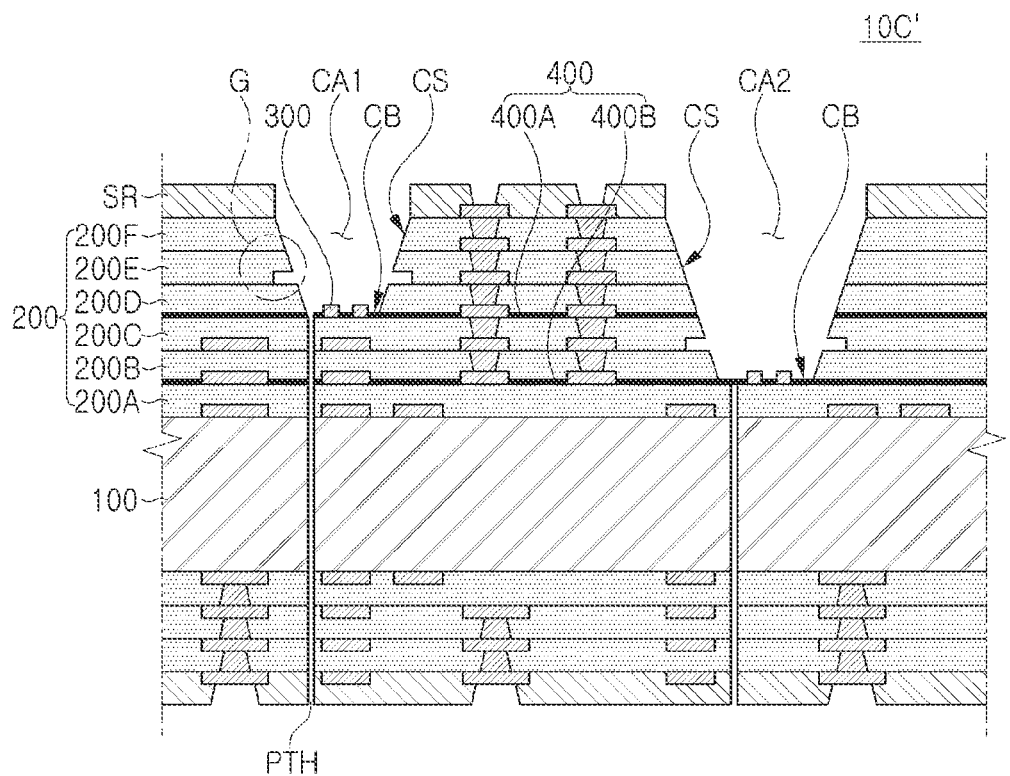
FIG. 5B is a diagram schematically illustrating an exemplary embodiment of a printed circuit board according to the present disclosure.

FIG. 5B is a diagram schematically illustrating an exemplary embodiment of a printed circuit board according to the present disclosure. FIG. 5B is substantially the same as FIG. 5A, except that the electronic component IC is omitted. For overlapping configurations, the above-described descriptions may be equally applied thereto, and detailed descriptions of FIG. 5B will be omitted.

Figure 6:
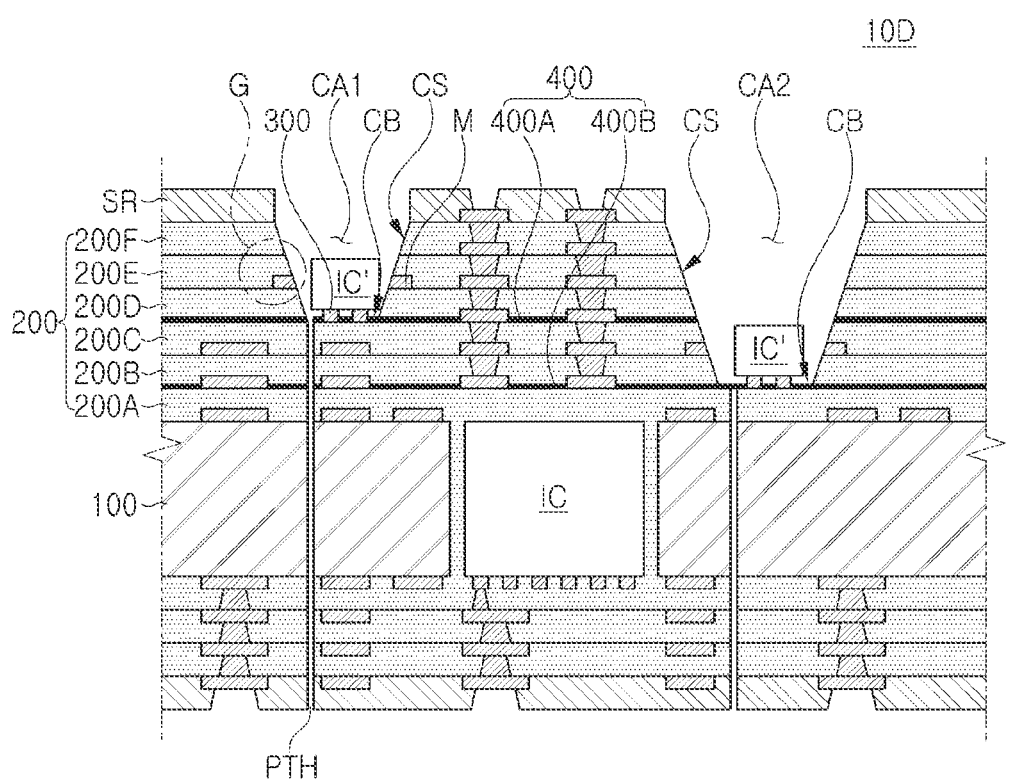
FIG. 6 is a diagram schematically illustrating an exemplary embodiment of a printed circuit board according to the present disclosure.
Figure 7A:
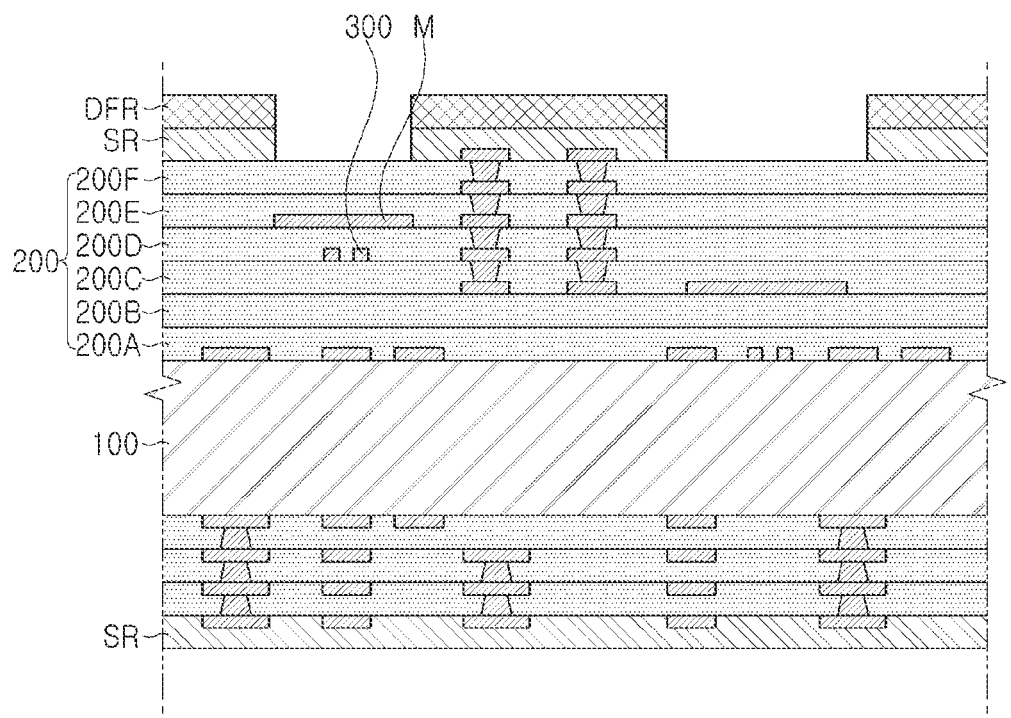
FIGS. 7A to 7D are diagrams schematically illustrating an exemplary embodiment of a method for manufacturing a printed circuit board according to the present disclosure.
Figure 7B:
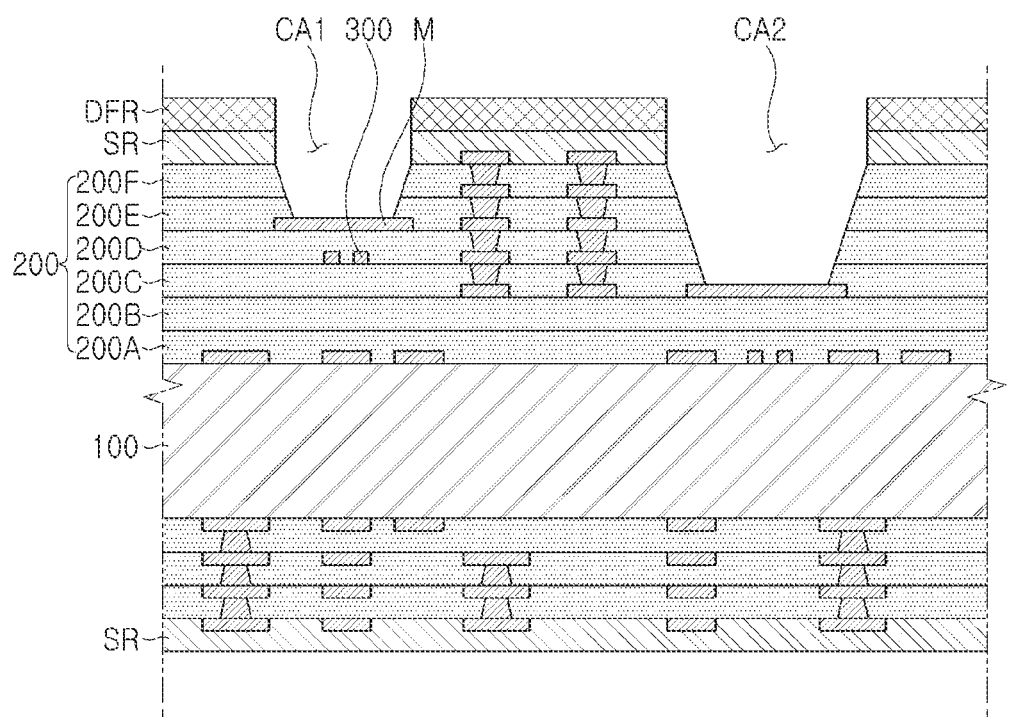
Figure 7C:
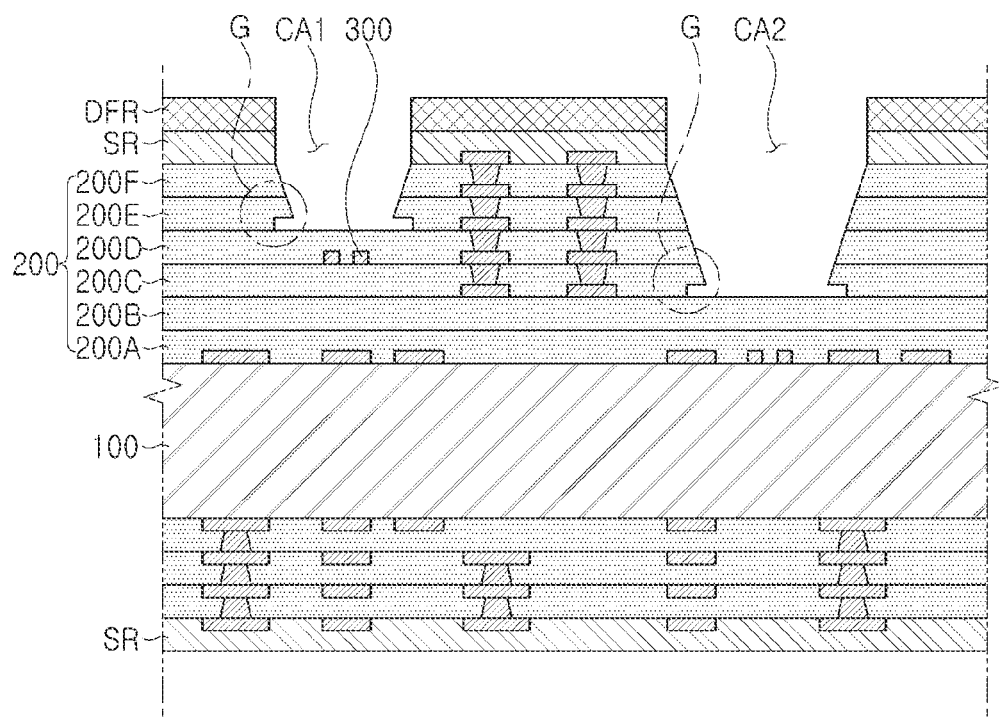
Figure 7D:
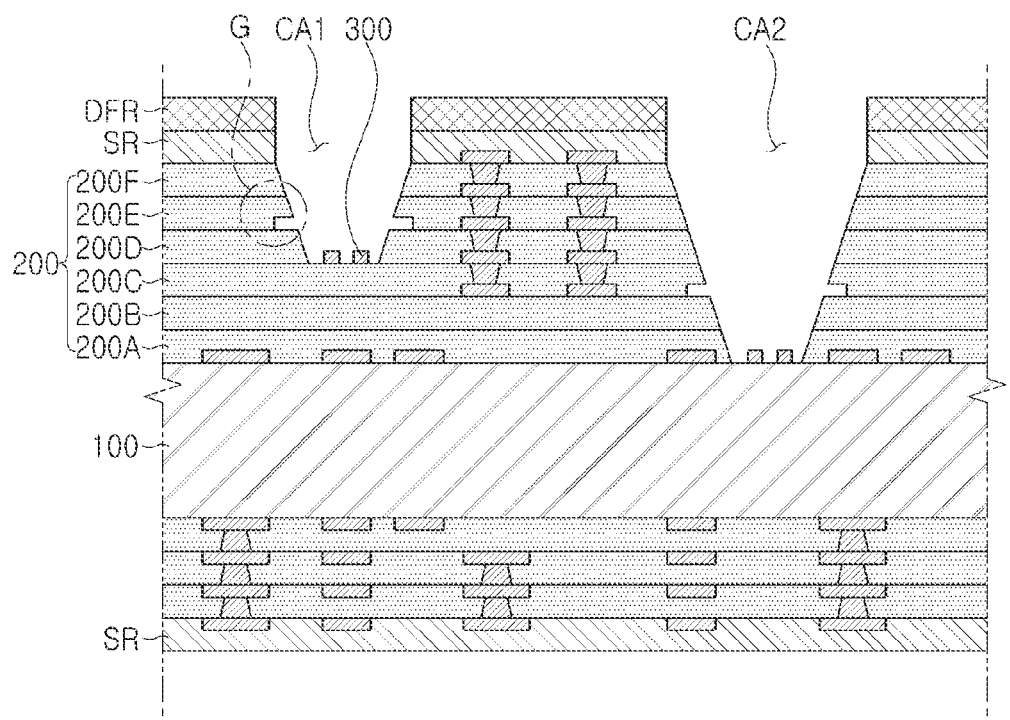

FIG. 6 is a diagram schematically illustrating an exemplary embodiment of a printed circuit board 10D according to the present disclosure.

Referring to FIG. 6, the printed circuit board 10D according to the present disclosure may include a first insulating material 100, and a second insulating material 200 disposed on one surface of the first insulating material 100 and including a plurality of cavities CA1 and CA2 having depths different from each other. In this case, the plurality of cavities CA1 and CA2 may be spaced apart to each other, but are not limited thereto. In addition, the first insulating material 100 may be an intermediate insulating layer or a core layer, but is not limited thereto.

In addition, the printed circuit board 10D according to the present disclosure may include at least one groove portion G in a side surface CS of each of the plurality of cavities CA1 and CA2 formed in the second insulating material 200. In this case, the groove portion G of each of the plurality of cavities CA1 and CA2 may be filled with a metal material M, but is not limited thereto.

Each of the circuit layers, the vias, the metal layers 300, and the metal materials M of the printed circuit board 10D according to the present disclosure may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto.

Concerning the other components, what has been described above is substantially identically applicable, and thus, the description thereof will not be repeated.

Method for Manufacturing Printed Circuit Board

FIGS. 7A to 7D are diagrams schematically illustrating an exemplary embodiment of a method for manufacturing a printed circuit board according to the present disclosure.

Referring to FIGS. 7A to 7D, a plurality of build-up insulating layers and circuit layers may be disposed on each of both surfaces of a first insulating material 100. In this case, a second insulating material 200 including a plurality of insulating layers 200A to 200F may be disposed on one surface of the first insulating material 100.

In addition, a circuit layer may be disposed on one surface of each of the plurality of insulating layers 200A to 200F of the second insulating material 200, and a metal material M may be disposed on at least one of the plurality of insulating layers 200A to 200F. In this case, as will be described below, the metal material M may function as a stopper at the time of forming each of first and second cavities CA1 and CA2, but is not limited thereto. In addition, the metal materials M may be spaced apart to each other in regions where the first and second cavities CA1 and CA2 to be described below are to be formed respectively, and may be disposed in different ones of the plurality of insulating layers 200A to 200F of the second insulating material 200, but are not limited thereto.

In addition, a metal layer 300 may be disposed on at least one of the plurality of insulating layers 200A to 200F of the second insulating material 200. In this case, the metal layer 300 may be at least partially exposed to a bottom surface CB of each of the first and second cavities CA1 and CA2 to be described below to function as a connection pad contacting an electronic component, but is not limited thereto.

When the first and second cavities CA1 and CA1 to be described below have depths different from each other, a plurality of metal layers 300 may be formed, and the metal layers 300 may be formed to be exposed to the respective bottom surfaces CB of the first and second cavities CA1 and CA2, but are not limited thereto. In this case, the plurality of metal layers 300 may be spaced apart to each other, but are not limited thereto.

A solder resist layer SR may be disposed on one surface of the uppermost insulating layer of the second insulating material 200. In this case, the solder resist layer SR may not be disposed in at least some of regions where the metal materials M are disposed, but is not limited thereto.

A photosensitive material DFR may be disposed on one surface of the solder resist layer SR. In this case, the photosensitive material DFR may be a component for protecting each of the build-up insulating layers and the solder resist layer SR at the time of forming the first and second cavities CA1 and CA2 to be described below, but is not limited thereto.

After laminating the solder resist layer SR and the photosensitive material DFR, a process for forming the first and second cavities CA1 and CA2 may be performed. In this case, each of the first and second cavities CA1 and CA2 may be formed through blast processing or laser processing, but is not limited thereto.

In addition, at the time of forming the first and second cavities CA1 and CA2, the processing may be performed until the metal materials M disposed on different ones of the plurality of insulating layers 200A to 200F are exposed. That is, the metal material M disposed on an upper one of the plurality of insulating layers 200A to 200F may function as a stopper at the time of forming the first cavity CA1, which has a smaller depth than the second cavity CA2, and the metal material M disposed on a lower one of the plurality of insulating layers 200A to 200F may function as a stopper at the time of forming the second cavity CA2, which has a larger depth than the first cavity CA1, but the metal materials M are not limited thereto.

That is, after disposing the metal materials M functioning as stoppers on different ones of the plurality of insulating layers 200A to 200F, the plurality of insulating layers 200A to 200F, the solder resist layer SR, and the photosensitive material DFR may be laminated. Thereafter, in the process of forming the first and second cavities CA1 and CA2, the metal material M disposed on the upper insulating layer may function as a stopper at the time of forming the first cavity CA1, which has a smaller depth, and the metal material M disposed on the lower insulating layer may function as a stopper at the time of forming the second cavity CA2, which has a larger depth, but the metal materials M are not limited thereto.

After the processing for forming the first and second cavities CA1 and CA2 is performed until the metal materials M are exposed, a process for removing the metal materials M may be performed. In this case, the metal materials M may be removed through an etching process. At the time of forming the first and second cavities CA1 and CA2, the metal material M embedded in a region of the second insulating material 200 that a blast abrasive or laser does not reach may form a groove portion G in each of the first and second cavities CA1 and CA2. In addition, the metal material M disposed in the groove portion G may be removed through the etching process as described above, but may remain unremoved. That is, the metal materials M exposed to the first and second cavities CA1 and CA2 may be removed, but are not limited thereto. The metal material M may be completely removed, without remaining in the groove portion G, to form the inside of the groove portion G as an empty space, but is not limited thereto.

After removing at least a portion of the metal material M, blast or laser processing may be performed once again until the metal layer 300 is exposed to the bottom surface CB of each of the first and second cavities CA1 and CA2. In this case, the metal layer 300 may be formed to protrude from the bottom surface CB of each of the first and second cavities CA1 and CA2, and the metal layer 300 exposed to the bottom surface CB of each of the first and second cavities CA1 and CA2 may function as a connection pad connected to an electronic component, but is not limited thereto.

After forming the first and second cavities CA1 and CA2, the photosensitive material DFR disposed on one surface of the solder resist layer SR may be removed. In addition, one or more through holes PTH penetrating through the first and second insulating materials 100 and 200 and connected to the bottom surfaces CB of the first and second cavities CA1 and CA2 may be formed.

Since the first and second cavities CA1 and CA2 having depths different from each other are formed by disposing only the metal materials M in the second insulating material 200 without performing a separate masking process as described above, a fine circuit can be formed, a process variation can be reduced, and a thin board can be manufactured.

Concerning the other components, what has been described above is substantially identically applicable, and thus, the description thereof will not be repeated.

Figure 8A:
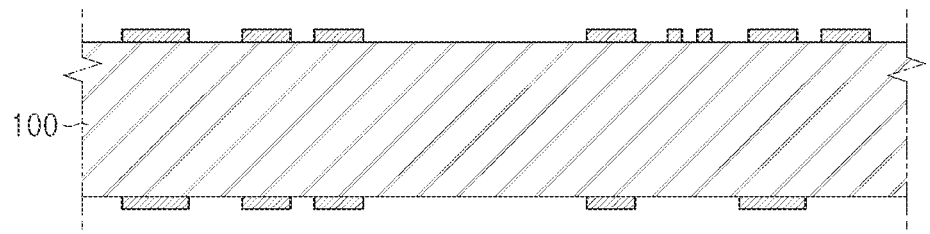
FIGS. 8A to 8C are diagrams schematically illustrating an exemplary embodiment of a method for manufacturing a printed circuit board according to the present disclosure.
Figure 8B:
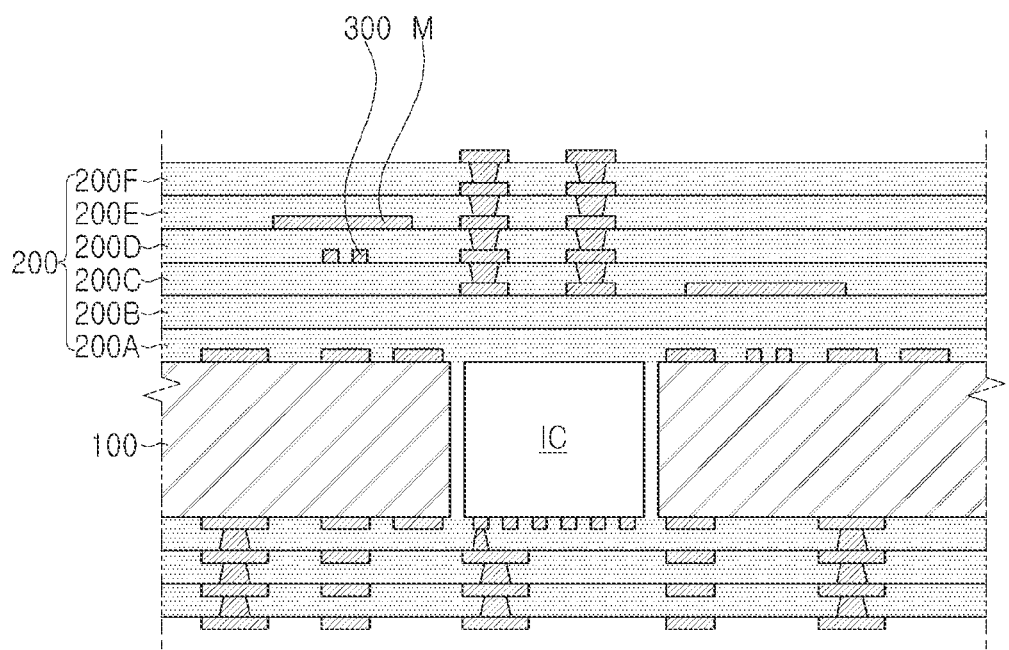
Figure 8C:
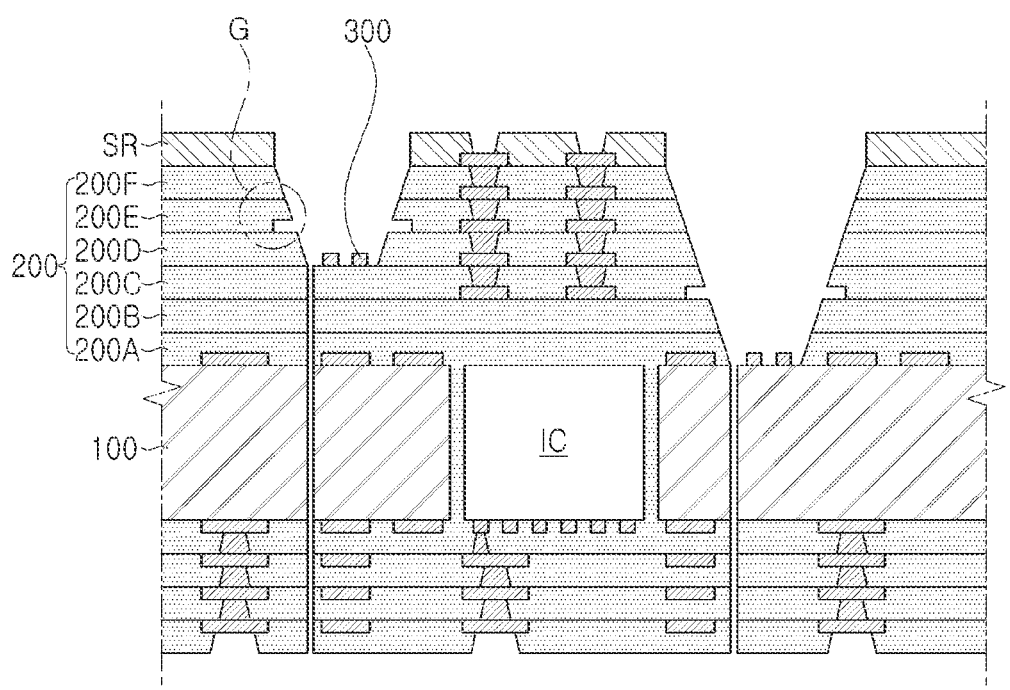
Figure 9A:
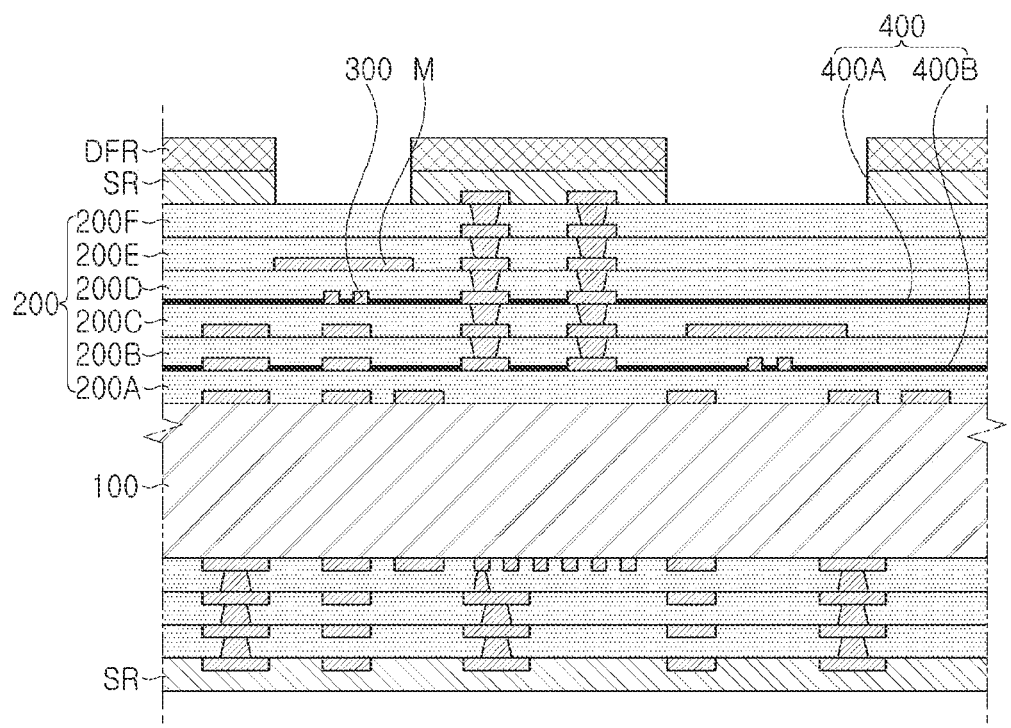
FIGS. 9A to 9D are diagrams schematically illustrating an exemplary embodiment of a method for manufacturing a printed circuit board according to the present disclosure.
Figure 9B:
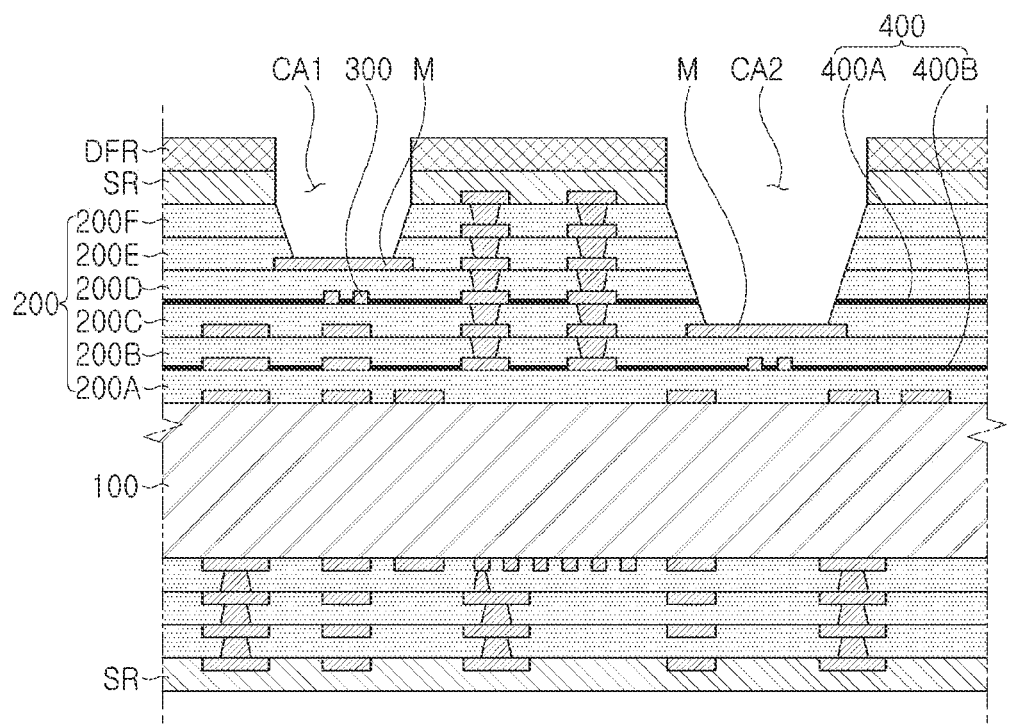
Figure 9C:
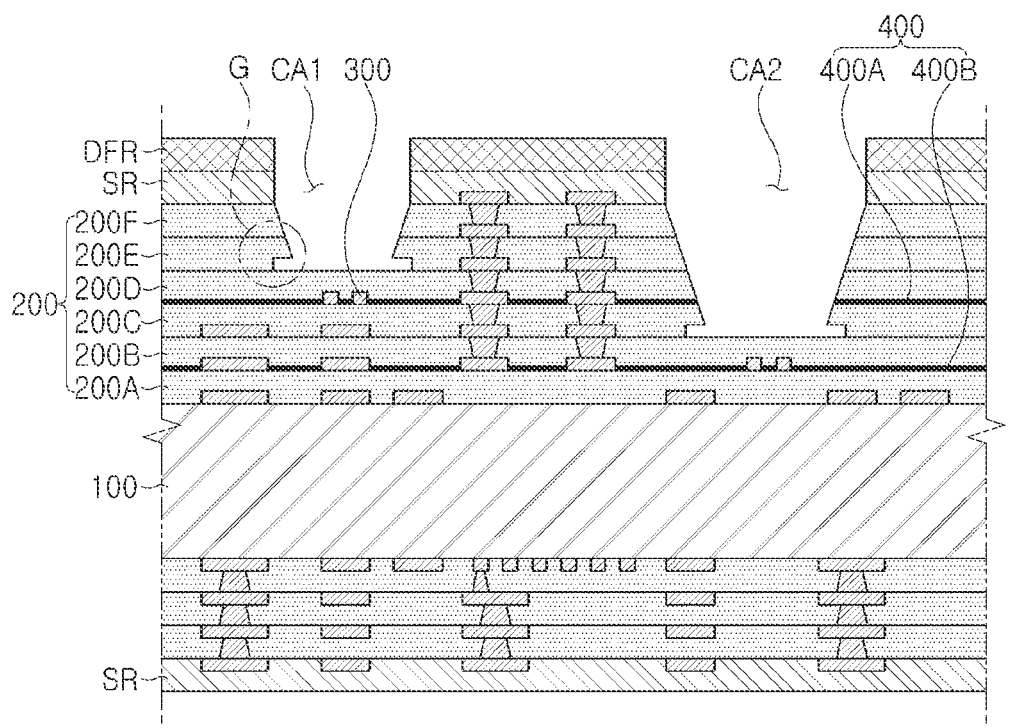
Figure 9D:
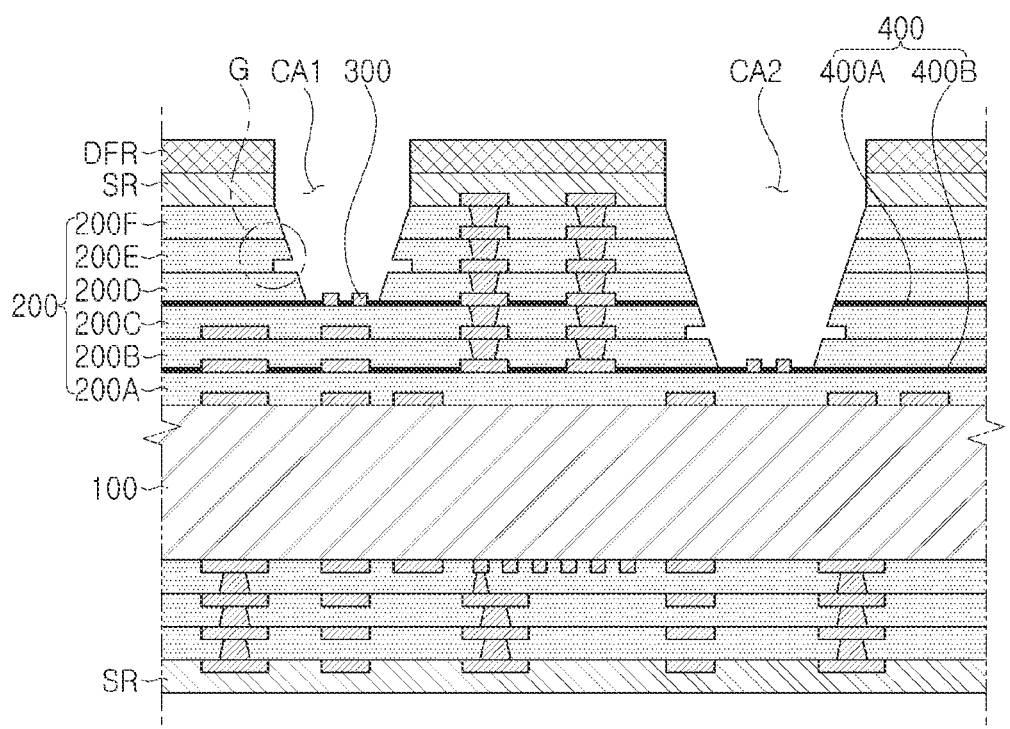
Figure 10A:
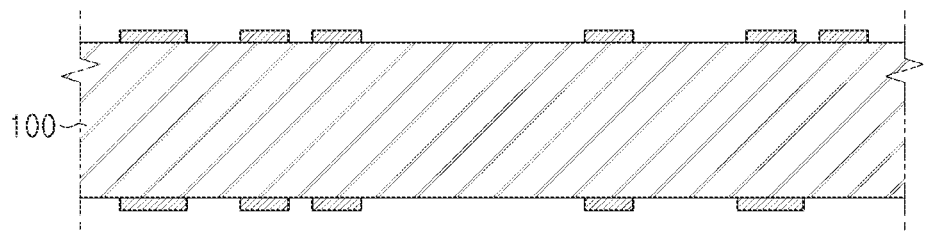
FIGS. 10A to 10F are diagrams schematically illustrating an exemplary embodiment of a method for manufacturing a printed circuit board according to the present disclosure.
Figure 10B:
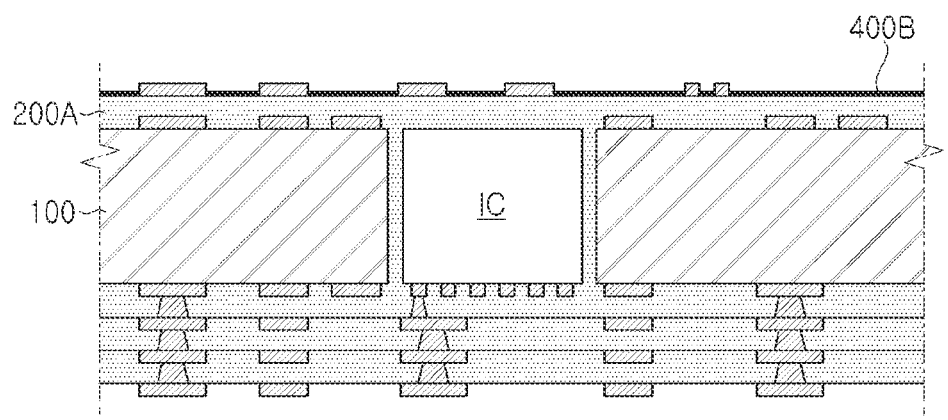
Figure 10C:
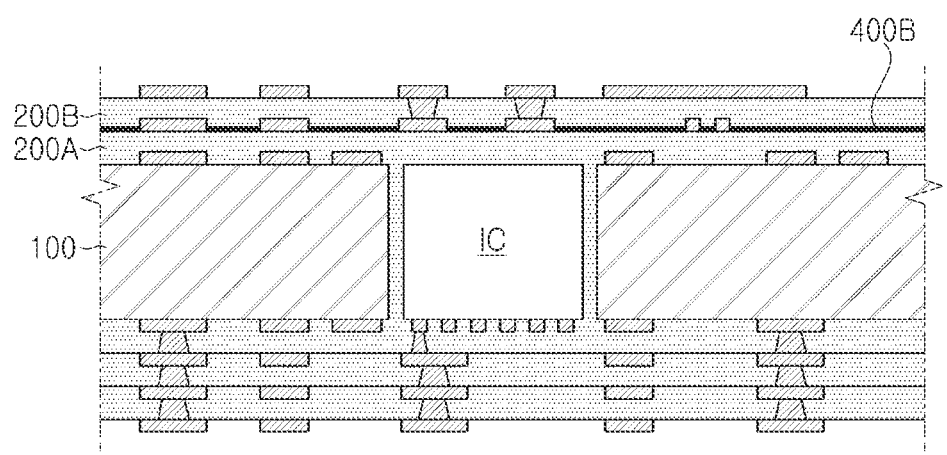
Figure 10D:
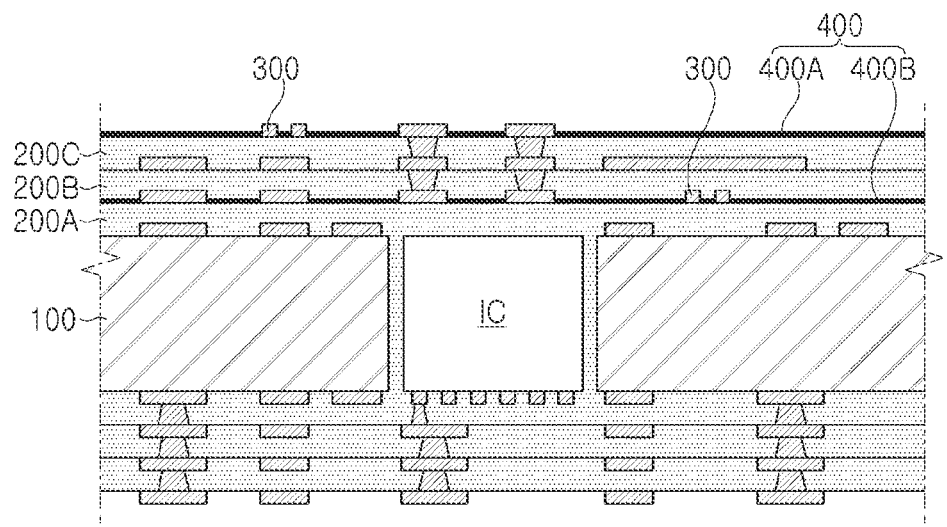
Figure 10E:
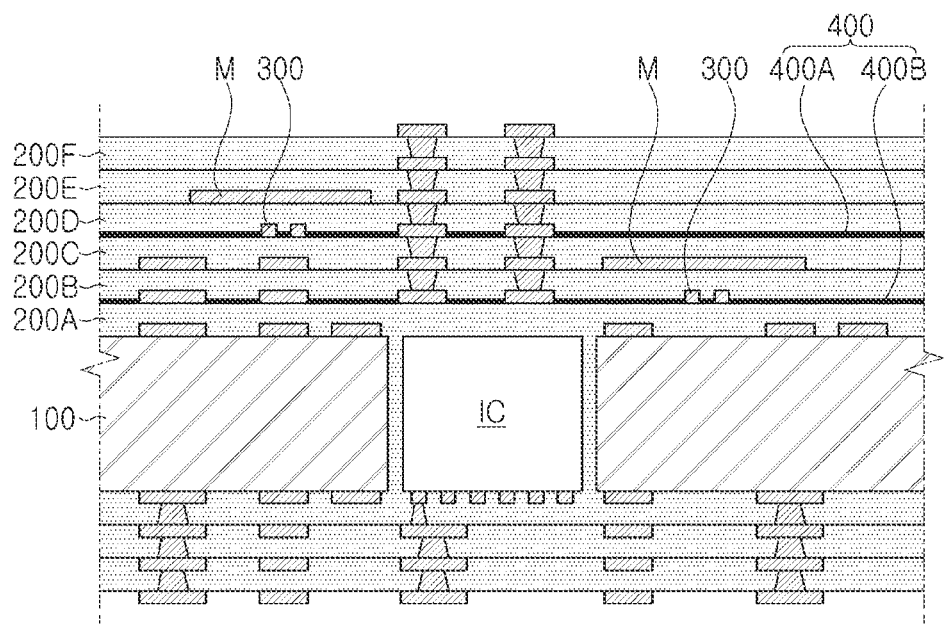
Figure 10F:
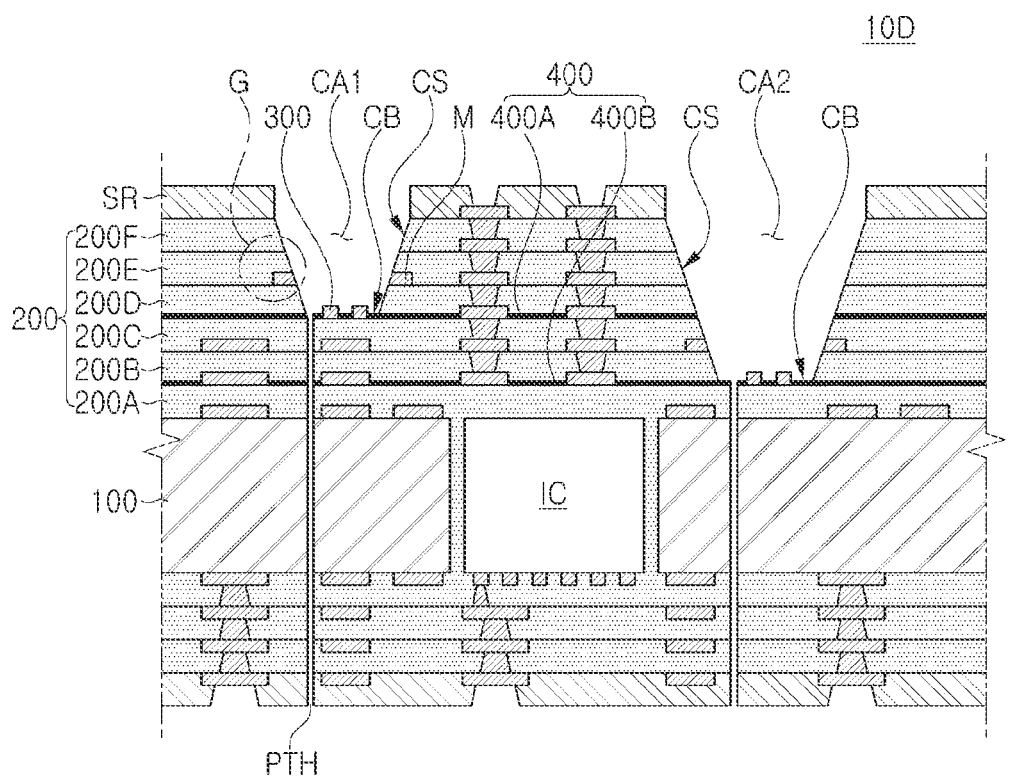

FIGS. 8A to 8C are diagrams schematically illustrating an exemplary embodiment of a method for manufacturing a printed circuit board according to the present disclosure.

Referring to FIGS. 8A to 8C, an electronic component IC may be mounted in an accommodating groove in a first insulating material 100 and embedded in a second insulating material 200.

Before disposing build-up insulating layers or a plurality of insulating layers on both surfaces of the first insulating material 100, the accommodating groove may be formed in the first insulating material 100 to accommodate the electronic component IC therein. The electronic component IC may be embedded in the second insulating material 200 that fills a remaining portion of the accommodating groove.

After disposing a plurality of insulating layers and circuit layers on both surfaces of the first insulating material 100, a process for forming first and second cavities CA1 and CA2 may be performed in the same manner as illustrated in FIGS. 7A to 7D.

Concerning the other components, what has been described above is substantially identically applicable, and thus, the description thereof will not be repeated.

FIGS. 9A to 9D are diagrams schematically illustrating an exemplary embodiment of a method for manufacturing a printed circuit board according to the present disclosure.

Referring to FIGS. 9A to 9D, a plurality of build-up insulating layers and circuit layers may be disposed on each of both surfaces of a first insulating material 100. In this case, a second insulating material 200 including a plurality of insulating layers 200A to 200F may be disposed on one surface of the first insulating material 100.

In addition, a resin layer 400 may be embedded in the second insulating material 200. In particular, the resin layer 400 may include a different material from the second insulating material 200, and more specifically, may include a filler, but is not limited thereto. In this case, the resin layer 400 may be disposed in a process of laminating the plurality of insulating layers 200A to 200F of the second insulating material 200.

In addition, a circuit layer may be disposed on one surface of each of the plurality of insulating layers 200A to 200F of the second insulating material 200, and a metal material M may be disposed on at least one of the plurality of insulating layers 200A to 200F. In this case, as will be described below, the metal material M may function as a stopper at the time of forming each of a plurality of cavities C, but is not limited thereto. In addition, a plurality of metal materials M may be spaced apart to each other in regions where the plurality of cavities CA1 and CA2 to be described below are to be formed respectively, and may be disposed in different ones of the plurality of insulating layers 200A to 200F of the second insulating material 200, but are not limited thereto. In addition, the plurality of circuit layers disposed on respective one surfaces of the plurality of insulating layers 200A to 200F of the second insulating material 200 may penetrate through at least a portion of the resin layer 400, but are not limited thereto.

In addition, a metal layer 300 may be disposed on at least one of the plurality of insulating layers 200A to 200F of the second insulating material 200. In this case, the metal layer 300 may be embedded in the insulating layer on which the resin layer 400 is disposed. That is, the metal layer 300 may be formed to at least partially contact one surface of the resin layer 400, but is not limited thereto. In this case, the metal layer 300 may be at least partially exposed to a bottom surface CB of each of the plurality of cavities CA1 and CA2 to be described below to function as a connection pad contacting an electronic component, but is not limited thereto.

When the plurality of cavities CA1 and CA2 to be described below have depths different from each other, a plurality of metal layers 300 and a plurality of resin layers 400 may be formed, and the metal layers 300 may be formed to be exposed to the respective bottom surfaces CB of the plurality of cavities C, but are not limited thereto. In this case, the plurality of metal layers 300 may be spaced apart to each other, and the plurality of resin layers 400A and 400B may also be spaced apart to each other, but the metal layers 300 and the resin layers 400A and 400B are not limited thereto. In particular, each one of the metal layers 300 and each one of the resin layers 400 may be disposed on the same one of the plurality of insulating layers 200A to 200F of the second insulating material 200, and in this case, the number of insulating layers on which the metal layers 300 and the resin layers 400 are disposed may be two or more, but is not limited thereto.

A solder resist layer SR may be disposed on one surface of the uppermost insulating layer of the second insulating material 200. In this case, the solder resist layer SR may not be disposed in at least some of regions where the metal materials M are disposed, but is not limited thereto.

A photosensitive material DFR may be disposed on one surface of the solder resist layer SR. In this case, the photosensitive material DFR may be a component for protecting each of the build-up insulating layers and the solder resist layer SR at the time of forming the plurality of cavities CA1 and CA2 to be described below, but is not limited thereto.

After laminating the solder resist layer SR and photosensitive material DFR, a process for forming the plurality of cavities CA1 and CA2 may be performed. In this case, the plurality of cavities CA1 and CA2 may be formed through blast processing or laser processing, but is not limited thereto.

In addition, at the time of forming the plurality of cavities CA1 and CA2, the processing may be performed until the metal materials M disposed on different ones of the plurality of insulating layers 200A to 200F are exposed. That is, the metal material M disposed on an upper one of the plurality of insulating layers 200A to 200F may function as a stopper at the time of forming a first cavity CA1, which has a smaller depth than a second cavity CA2, and the metal material M disposed on a lower one of the plurality of insulating layers 200A to 200F may function as a stopper at the time of forming the second cavity CA2, which has a larger depth than the first cavity CA1, but the metal materials M are not limited thereto.

That is, after disposing the metal materials M functioning as stoppers on different ones of the plurality of insulating layers 200A to 200F, the plurality of insulating layers 200A to 200F, the solder resist layer SR, and the photosensitive material DFR may be laminated. Thereafter, in the process of forming the plurality of cavities C, the metal material M disposed on the upper insulating layer may function as a stopper at the time of forming the first cavity CA1, which has a smaller depth, and the metal material M disposed on the lower insulating layer may function as a stopper at the time of forming the second cavity CA2, which has a larger depth, but the metal materials M are not limited thereto.

After the processing for forming the plurality of cavities CA1 and CA2 is performed until the metal materials M are exposed, a process for removing the metal materials M may be performed. In this case, the metal materials M may be removed through an etching process. At the time of forming the plurality of cavities CA1 and CA2, the metal material M embedded in a region of the insulating layer that a blast abrasive or laser does not reach may form a groove portion G in each of the plurality of cavities C. In addition, the metal material M disposed in the groove portion G may be removed through the etching process as described above, but may remain unremoved. That is, the metal materials M exposed to the plurality of cavities CA1 and CA2 may be removed, but are not limited thereto. The metal material M may be completely removed, without remaining in the groove portion G, to form the inside of the groove portion G as an empty space, but is not limited thereto.

After removing at least a portion of the metal material M, blast or laser processing may be performed once again until the metal layer 300 is exposed to the bottom surface CB of each of the plurality of cavities CA1 and CA2. In this case, the metal layer 300 may be formed to protrude from the bottom surface CB of each of the plurality of cavities CA1 and CA2, and the metal layer 300 exposed to the bottom surface CB of each of the plurality of cavities CA1 and CA2 may function as a connection pad connected to an electronic component, but is not limited thereto.

After forming the plurality of cavities CA1 and CA2, the photosensitive material DFR disposed on one surface of the solder resist layer SR may be removed. In addition, one or more through holes PTH penetrating through the first and second insulating materials 100 and 200 and connected to the bottom surfaces CB of the plurality of cavities CA1 and CA2 may be formed.

Since the plurality of cavities having depths different from each other are formed by disposing only the metal materials M in the second insulating material 200 without performing a separate masking process as described above, a fine circuit can be formed, a process variation can be reduced, and a thin board can be manufactured.

Concerning the other components, what has been described above is substantially identically applicable, and thus, the description thereof will not be repeated.

FIGS. 10A to 10F are diagrams schematically illustrating an exemplary embodiment of a method for manufacturing a printed circuit board according to the present disclosure.

Referring to FIGS. 10A to 10F, an electronic component IC may be mounted in an accommodating groove in a first insulating material 100 and embedded in a second insulating material 200.

Before disposing build-up insulating layers or a plurality of insulating layers on both surfaces of the first insulating material 100, the accommodating groove may be formed in the first insulating material 100 to accommodate the electronic component IC therein. The electronic component IC may be embedded in the second insulating material 200 that fills a remaining portion of the accommodating groove.

After disposing a plurality of insulating layers and circuit layers on both surfaces of the first insulating material 100, a process for forming a plurality of cavities CA1 and CA2 may be performed in the same manner as illustrated in FIGS. 9A to 9D.

Concerning the other components, what has been described above is substantially identically applicable, and thus, the description thereof will not be repeated.

As set forth above, as one effect of the present disclosure, it is possible to provide a printed circuit board including a fine circuit and/or a fine via.

As another effect of the present disclosure, it is possible to provide a printed circuit board with an electronic component mounted in a cavity thereof.

As another effect of the present disclosure, it is possible to provide a printed circuit board having a reduced process variation when a cavity thereof is formed.

While exemplary embodiments have been shown and described above, it will be apparent to those skilled in the art that modifications and variations could be made without departing from the scope of the present invention as defined by the appended claims.

What is claimed is:

1. A printed circuit board comprising:
a first insulating material; and
a second insulating material disposed on one surface of the first insulating material in a stacking direction, and including first and second cavities having depths different from each other,
wherein at least one groove portion is disposed in a side surface, and spaced apart in the stacking direction from a bottom surface, of each of the first and second cavities, and
wherein the at least one groove portion includes an end portion covered by the second insulating material in a direction perpendicular to the stacking direction.

2. The printed circuit board of claim 1, wherein the first and second cavities are spaced apart from each other in the direction perpendicular to the stacking direction.

3. The printed circuit board of claim 1, wherein the groove portion of each of the first and second cavities is filled with a metal material.

4. The printed circuit board of claim 1, further comprising a metal layer disposed on the bottom surface of one of the first and second cavities.

5. The printed circuit board of claim 4, wherein the metal layer protrudes from the bottom surface of the one of the first and second cavities.

6. The printed circuit board of claim 1, further comprising a resin layer including a different material from the second insulating material,
wherein the resin layer is provided as some of the bottom surface and the side surface of one of the first and second cavities.

7. The printed circuit board of claim 1, further comprising a through hole penetrating through both the first and second insulating materials and connected to the bottom surface of one of the first and second cavities.

8. The printed circuit board of claim 1, further comprising:
an accommodating groove formed in the first insulating material; and
an electronic component mounted in the accommodating groove and embedded in the second insulating material.

9. The printed circuit board of claim 1, further comprising a solder resist layer disposed on one surface of the second insulating material.

* * * * *